(12) United States Patent
Kristl et al.

(10) Patent No.: US 11,412,622 B2
(45) Date of Patent: Aug. 9, 2022

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventors: Thomas Kristl, Trofaiach (AT); Ewald Moitzi, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/808,109

(22) Filed: Mar. 3, 2020

(65) Prior Publication Data

US 2020/0296842 A1 Sep. 17, 2020

(30) Foreign Application Priority Data

Mar. 12, 2019 (EP) ..................... 19162269

(51) Int. Cl.
*H05K 1/02* (2006.01)
*H05K 1/03* (2006.01)
(Continued)

(52) U.S. Cl.
CPC ......... *H05K 3/4688* (2013.01); *H05K 1/0298* (2013.01); *H05K 3/4652* (2013.01); *H05K 3/4673* (2013.01)

(58) Field of Classification Search
CPC .. H05K 1/02; H05K 1/03; H05K 1/09; H05K 1/11; H05K 1/16; H05K 1/18; H05K 1/115; H05K 1/0222; H05K 1/0237; H05K 1/0298; H05K 3/00; H05K 3/06; H05K 3/10; H05K 3/30; H05K 3/38; H05K 3/42; H05K 3/46; H05K 3/538; H05K 3/4652; H05K 3/4673; H05K 3/4688; H01L 21/02;
(Continued)

(56) References Cited

U.S. PATENT DOCUMENTS 3,391,454 A 7/1968 Reimann et al.
3,605,260 A 9/1971 Spridco et al.
(Continued)

OTHER PUBLICATIONS

Schweiger, D.; Communication Pursuant to Article 94(3) EPC in Application No. 19162269.5; pp. 1-8; Apr. 22, 2022; European Patent Office; Postbus 5818; 2280 HV Rijswijk; Netherlands.

*Primary Examiner* — Xiaoliang Chen
(74) *Attorney, Agent, or Firm* — Robert A. Blaha; Smith Tempel Blaha LLC

(57) ABSTRACT

A component carrier includes a stack having an electrically conductive layer structure, with at least one recess, on an electrically insulating layer structure; a dielectric filling medium filling at least part of the at least one recess; and a further electrically insulating layer structure on the electrically conductive layer structure and on the dielectric filling medium. A method of manufacturing a component carrier includes forming a stack having an electrically conductive layer structure, with at least one recess, on an electrically insulating layer structure; at least partially filling the at least one recess by a dielectric filling medium; and thereafter forming a further electrically insulating layer structure on the electrically conductive layer structure and on the dielectric filling medium.

13 Claims, 5 Drawing Sheets

(51) Int. Cl.

| | |
|---|---|
| *H05K 1/09* | (2006.01) |
| *H05K 1/11* | (2006.01) |
| *H05K 1/16* | (2006.01) |
| *H05K 1/18* | (2006.01) |
| *H05K 3/00* | (2006.01) |
| *H05K 3/06* | (2006.01) |
| *H05K 3/10* | (2006.01) |
| *H05K 3/30* | (2006.01) |
| *H05K 3/38* | (2006.01) |
| *H05K 3/42* | (2006.01) |
| *H05K 3/46* | (2006.01) |
| *H01L 21/02* | (2006.01) |
| *H01L 21/44* | (2006.01) |
| *H01L 21/48* | (2006.01) |
| *H01L 21/8239* | (2006.01) |
| *H01L 23/02* | (2006.01) |
| *H01L 23/34* | (2006.01) |
| *H01L 23/48* | (2006.01) |
| *H01L 23/52* | (2006.01) |
| *H01L 23/46* | (2006.01) |
| *H01L 23/66* | (2006.01) |
| *H01L 23/498* | (2006.01) |

(58) Field of Classification Search
CPC ......... H01L 21/44; H01L 21/48; H01L 23/48; H01L 23/52; H01L 23/46; H01L 23/385; H01L 23/498; H01L 21/8239; H01L 23/02; H01L 23/34; H01L 23/50; H01L 23/66; H01L 23/49822
USPC ......... 361/748, 774, 783; 174/250, 255–258, 174/261–262, 264, 266; 428/76; 336/200; 156/60, 252; 438/269; 257/678
See application file for complete search history.

(56) References Cited

U.S. PATENT DOCUMENTS

| | | | | |
|---|---|---|---|---|
| 6,010,769 A * | 1/2000 | Sasaoka | .................. | H01L 24/16 428/209 |
| 6,237,218 B1 * | 5/2001 | Ogawa | ................ | H05K 3/4638 174/254 |
| 6,365,843 B1 * | 4/2002 | Shirai | .................... | H05K 1/113 174/262 |
| 6,407,345 B1 * | 6/2002 | Hirose | ................ | H05K 1/113 174/261 |
| 6,512,186 B1 * | 1/2003 | Nishiwaki | ............. | H05K 3/384 174/261 |
| 6,518,514 B2 * | 2/2003 | Suzuki | ................ | H05K 1/0373 174/255 |
| 6,828,510 B1 * | 12/2004 | Asai | ...................... | H05K 3/387 174/255 |
| 6,930,258 B1 * | 8/2005 | Kawasaki | ......... | H01L 23/49816 174/264 |
| 6,998,336 B1 * | 2/2006 | Iba | ....................... | H05K 3/3485 438/612 |
| 7,227,247 B2 * | 6/2007 | Zeng | ....................... | H01L 23/50 257/E23.079 |
| 8,003,896 B2 * | 8/2011 | Wu | ....................... | H05K 3/4602 174/262 |
| 8,203,080 B2 * | 6/2012 | Vasoya | ................ | H05K 1/0313 174/255 |
| 2001/0003610 A1 * | 6/2001 | Nakatani | .............. | H05K 3/4069 428/131 |
| 2001/0004944 A1 * | 6/2001 | Nakamura | ............ | H05K 3/4038 174/262 |
| 2001/0042637 A1 * | 11/2001 | Hirose | ................ | H05K 3/4623 174/255 |
| 2002/0023895 A1 * | 2/2002 | Iida | ...................... | H05K 3/4647 216/13 |
| 2002/0046880 A1 * | 4/2002 | Takubo | ................ | H05K 3/4691 174/261 |
| 2002/0117743 A1 * | 8/2002 | Nakatani | ............... | H01L 23/5384 257/687 |
| 2003/0102151 A1 * | 6/2003 | Hirose | .................. | H05K 3/4602 174/250 |
| 2004/0158980 A1 * | 8/2004 | Nakatani | ............ | H01L 23/49816 29/852 |
| 2005/0230848 A1 * | 10/2005 | Nakatani | ............ | H01L 23/5384 257/783 |
| 2006/0180905 A1 * | 8/2006 | Zeng | .................. | H01L 23/49822 257/E23.079 |
| 2008/0011507 A1 * | 1/2008 | Vasoya | .................... | H05K 1/11 174/260 |
| 2008/0041615 A1 * | 2/2008 | Zhong | .................... | H05K 3/285 174/255 |
| 2008/0236876 A1 * | 10/2008 | Kodama | .................. | G02B 6/43 174/260 |
| 2008/0314632 A1 * | 12/2008 | Wu | ....................... | H05K 3/4602 174/263 |
| 2009/0053459 A1 * | 2/2009 | Hirose | .................. | H05K 1/112 428/76 |
| 2009/0243065 A1 * | 10/2009 | Sugino | ................ | H01L 25/0657 257/686 |
| 2009/0293271 A1 * | 12/2009 | Tanaka | ............. | H01L 23/49827 29/832 |
| 2009/0294161 A1 * | 12/2009 | Yoshimura | ........... | H05K 3/4641 174/258 |
| 2009/0294166 A1 * | 12/2009 | Yoshimura | ........... | H05K 3/4608 174/264 |
| 2010/0006334 A1 * | 1/2010 | Takenaka | ........... | H05K 3/4682 174/262 |
| 2010/0024212 A1 | 2/2010 | Okabe et al. | | |
| 2010/0163290 A1 * | 7/2010 | Nagata | .................... | H05K 1/185 174/260 |
| 2010/0307803 A1 * | 12/2010 | Paul | .................... | H05K 3/4676 174/257 |
| 2011/0035938 A1 | 2/2011 | Kweon et al. | | |
| 2011/0051386 A1 * | 3/2011 | Nagasawa | ............... | H05K 1/115 361/783 |
| 2011/0114372 A1 * | 5/2011 | Kato | ...................... | H05K 1/115 174/256 |
| 2011/0232948 A1 * | 9/2011 | Sato | .................... | H05K 3/4661 174/255 |
| 2011/0314666 A1 * | 12/2011 | Harazono | ............ | H05K 3/4644 29/832 |
| 2012/0055706 A1 * | 3/2012 | Mok | .................... | H05K 1/162 174/260 |
| 2012/0110839 A1 * | 5/2012 | Nishio | ................. | H05K 3/4664 29/830 |
| 2012/0212919 A1 * | 8/2012 | Mano | ...................... | H05K 3/4602 361/782 |
| 2012/0247818 A1 * | 10/2012 | Adachi | .................. | H05K 3/445 174/257 |
| 2012/0250281 A1 * | 10/2012 | Kawai | ................... | H05K 3/427 361/774 |
| 2013/0149514 A1 * | 6/2013 | Hayashi | .................. | H01B 3/02 428/213 |
| 2013/0164894 A1 * | 6/2013 | Kim | ....................... | H01L 29/7889 438/269 |
| 2013/0222003 A1 * | 8/2013 | Taguchi | ............. | G01R 1/07342 324/754.11 |
| 2014/0118976 A1 * | 5/2014 | Yoshikawa | ....... | H01L 23/49827 361/763 |
| 2014/0301058 A1 * | 10/2014 | Sunohara | ......... | H01L 23/49827 361/783 |
| 2015/0163919 A1 * | 6/2015 | Nakagome | ........ | H01L 23/49827 174/255 |
| 2015/0213946 A1 * | 7/2015 | Mano | ...................... | H01F 17/04 336/200 |
| 2015/0271923 A1 * | 9/2015 | Shimabe | ............ | H05K 3/4602 174/251 |
| 2015/0366102 A1 * | 12/2015 | Ishihara | ................. | H05K 3/429 361/711 |

(56) References Cited

U.S. PATENT DOCUMENTS

| | | | |
|---|---|---|---|
| 2016/0088741 A1 | 3/2016 | Van Den Bersselaar | |
| 2016/0113120 A1* | 4/2016 | Ishihara | H05K 3/4682 |
| | | | 174/262 |
| 2016/0381781 A1* | 12/2016 | Park | H05K 1/0204 |
| | | | 174/252 |
| 2017/0018492 A1* | 1/2017 | Imayoshi | H01L 23/49827 |
| 2017/0110393 A1 | 4/2017 | Tain et al. | |
| 2017/0250141 A1* | 8/2017 | Imayoshi | H05K 3/46 |
| 2018/0233553 A1* | 8/2018 | Tomikawa | H01L 28/60 |
| 2018/0376589 A1* | 12/2018 | Harazono | H05K 1/024 |
| 2019/0123016 A1* | 4/2019 | Lin | H01L 21/563 |
| 2020/0303799 A1* | 9/2020 | Wang | H01P 5/028 |
| 2021/0134723 A1* | 5/2021 | May | H01L 23/293 |

\* cited by examiner

COMPONENT CARRIER AND METHOD OF MANUFACTURING THE SAME

CROSS-REFERENCE TO RELATED APPLICATION

This application claims the benefit of the filing date of the European patent application no. 19 162 269.5, filed on Mar. 12, 2019, which is incorporated herein by reference in its entirety.

TECHNICAL FIELD

Embodiments of the invention relate to a component carrier and to a method of manufacturing the component carrier.

TECHNOLOGICAL BACKGROUND

A conventional component carrier comprises a stack having an electrically conductive layer structure on an electrically insulating layer structure. The electrically conductive layer structure is structured or patterned, for example by etching. A further electrically insulating layer structure, for example a prepreg, is then applied on the patterned electrically conductive layer structure. Because of different designs of the patterned electrically conductive layer structure, the stack may have an uneven surface, which may lead to a relief transfer to upper layers during a lamination process. Due to the relief transfer, certain problems may occur in the subsequent manufacturing process. For example, a resist cannot sufficiently adhere in dimples which are formed by the relief transfer. In a lithographic process, the resist can accidentally be released during an etching step so that a circuit error in the component carrier might occur.

Furthermore, in a grinding process after a plugging process, particles or a pasty waste material can be deposited in the dimples which are formed by the relief transfer.

It is conceivable to overcome this problem by additional grinding steps. However, at raised locations which are formed by the relief transfer, too much material could be ground off which may lead to deficiencies such as a lack of copper at the raised locations. In this case, a circuit error might still occur in the component carrier.

SUMMARY

There is a need to provide a component carrier and to provide a method of manufacturing the same, by which a circuit error in the component carrier can be avoided.

This need is fulfilled by a component and a method of manufacturing the same according to the independent claims.

According to an exemplary embodiment of the invention, a component carrier is provided. The component carrier comprises: a stack comprising an electrically conductive layer structure, having at least one recess, on an electrically insulating layer structure; dielectric filling medium filling at least part of the at least one recess; and a further electrically insulating layer structure on the electrically conductive layer structure and on the dielectric filling medium.

According to another exemplary embodiment of the invention, a method of manufacturing a component carrier is provided. The method comprises: forming a stack comprising an electrically conductive layer structure, having at least one recess, on an electrically insulating layer structure; at least partially filling the at least one recess by a dielectric filling medium; and thereafter forming a further electrically insulating layer structure on the electrically conductive layer structure and on the dielectric filling medium.

OVERVIEW OF EMBODIMENTS

If the component carrier comprises a plurality of electrically insulating layer structures, for example in a multilayer configuration, it is not necessary to fill the recesses of all the cores by the dielectric filling medium. That is, the relief transfer can sufficiently be compensated when only the recesses of a part of the cores are filled by the dielectric filling medium.

A multilayer configuration is usually created by stacking a plurality of patterned dielectric layer structures and/or cores. The patterned dielectric layers and/or cores, as pressed together, do not necessarily need to be homogenous but can have different thicknesses. The thicknesses of the conductive (copper) material could also be asymmetrical, e.g. 18 µm on a top side of dielectric layer and 35 µm on a bottom side of the dielectric layer even in the same multilayer configuration.

It is further not necessary to fill all of the recesses of one electrically conductive layer structure by the dielectric filling medium. That is, the relief transfer can sufficiently be compensated when only a part of the recesses of one electrically conductive layer structure are filled by the dielectric filling medium, for example recesses having a diameter which is larger than a predetermined diameter.

Advantageously, uneven surfaces and relief transfers can be compensated before performing the lamination process because the recesses are filled for example after an etching process and before a lamination process. By filling the recesses, height differences and dimples created for example by a pattern of the electrically conductive layer structure on the electrically insulating layer structure can be minimized. As a result, the relief transfer can also be minimized during a subsequent lamination process. A particular grinding step for compensating the relief transfer is not necessary anymore. In addition, the number of the further electrically insulating layer structures, which are for example prepreg layers, can be reduced since the relief transfer is minimized by the dielectric filling medium.

Furthermore, the relief transfer can be avoided regardless of the design of the electrically conductive layer structure and regardless of the number of the electrically insulating layer structures, for example regardless of the number of the cores.

As another advantage of the present invention, the impedance of the component carrier is made homogenous because of the dielectric filling medium. A homogenous impedance is relevant in particular in high frequency and low frequency applications.

Moreover, the electrically conductive layer structures, in particular conductive traces, are protected by the dielectric filling medium, for example during a subsequent lamination or pressing step.

In the following, further exemplary embodiments of the present invention will be explained.

In an embodiment, the stack comprises a further electrically conductive layer structure, having at least one further recess, on an opposing surface of the electrically insulating layer structure; a further dielectric filling medium filling at least part of the at least one further recess; and another electrically insulating layer structure on the further electrically conductive layer structure and on the further dielectric filling medium.

In an embodiment, the dielectric filling medium underfills the at least one recess and/or the further dielectric filling medium underfills the at least one further recess. By underfilling the recesses, the adhesion of subsequent layers is improved and mechanical stress caused by a possible resin flow in the stack is restricted by the dielectric filling mediums.

In an embodiment, the dielectric filling medium overfills the at least one recess and/or the further dielectric filling medium overfills the at least one further recess. By overfilling the recesses, the thickness of the dielectric filling medium can be adjusted to obtain desired dielectric characteristics, which can otherwise not be obtained by conventional prepreg layers and cores. In addition, dielectric filling mediums are usually inexpensive. After overfilling, the dielectric filling medium and/or the further dielectric filling medium can optionally be removed by grinding.

In an embodiment, the further electrically insulating layer structure is made of the same material like the dielectric filling medium so that the manufacturing costs can be reduced.

In an embodiment, the further electrically insulating layer structure is made of another material than the dielectric filling medium. For example, the further electrically insulating layer structure can be a prepreg, whereas the dielectric filling medium is a resin without fibers. However, it is possible to include fillers or particles into the resin of the dielectric filling medium. In an embodiment, the dielectric filling medium comprises at least one of powder, fluid, and filler particles. The dielectric filling medium can also be a paste, or sheet, in particular a glass free resin sheet such as ABF®. ABF® is a registered mark of Ajinomoto Co. Inc. of Tokyo, Japan.

In an embodiment, a difference between a maximum and a minimum of at least one of the layer structures is less than 20%, in particular less than 10%, of the thickness of the respective layer structure. The inventors found out that the relief transfer can sufficiently be removed by these parameters.

In an embodiment, the dielectric filling medium has a larger thermal conductivity than at least one of the electrically insulating layer structure and the further electrically insulating layer structure. The thermal conductivity of the component carrier can even be adjusted by selecting an appropriate dielectric filling medium.

In an embodiment, the electrically insulating layer structure is a core, in particular a fully cured core.

In the context of the present application, the term "core" may particularly denote a dielectric layer such as a layer of a cured prepreg material (for example FR4) with layers or patterns of a conductive material on both main surfaces (or on only one main surface) of the dielectric layer.

In an embodiment, the further electrically insulating layer structure is laminated on the electrically conductive layer structure and the dielectric filling medium.

In an embodiment, the component carrier comprises at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment, the method comprises applying the dielectric filling medium by one of the group consisting of dispensing, screen printing, and three-dimensionally reprinting. The dielectric filling medium can thus be applied in a liquid state. The dielectric filling medium does usually not contain fibers. The dielectric filling medium is therefore not necessarily formed by a prepreg or another sheet including fibers.

In an embodiment, the method comprises adjusting the thermal conductivity of the component carrier by selecting the dielectric filling medium.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (teflon®), a ceramic, and a metal oxide. Teflon® is a registered mark of The Chemours Co. FC LLC of Wilmington, Del., U.S.A. Reinforcing materials such as webs, fibers or spheres, for example made of glass (multi-layer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
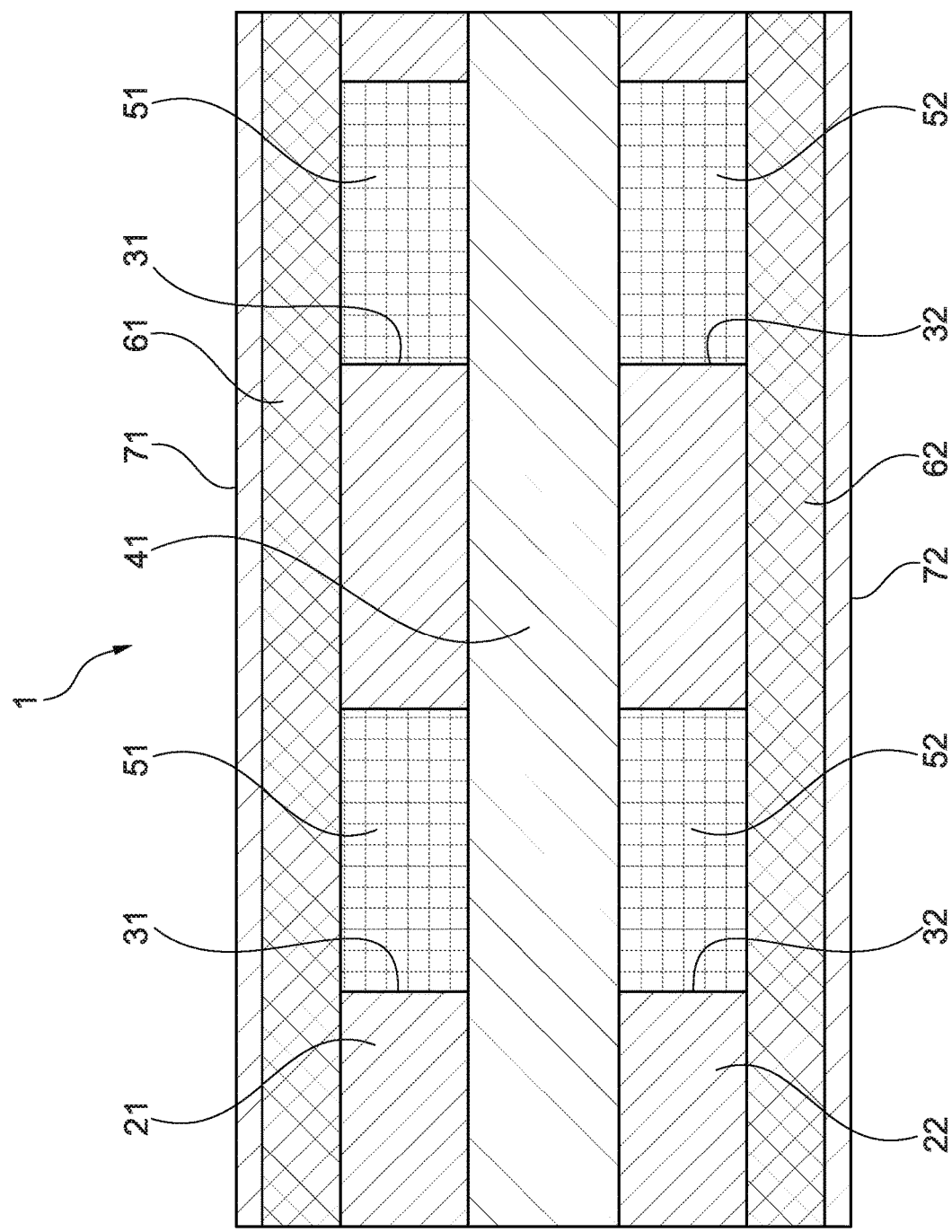
FIG. 1 illustrates a cross-sectional view of a component carrier according to an exemplary embodiment of the invention.

The illustrations in the drawings are schematically presented. In different drawings, similar or identical elements are provided with the same reference signs.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or a PCB elements (such as cores, prepregs, copper foils, etc.), that exhibits, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

FIG. 1 illustrates a cross-sectional view of a component carrier 1 according to an exemplary embodiment of the invention. The component carrier 1 comprises a stack having an electrically conductive layer structure 21 on an electrically insulating layer structure 41. The electrically insulating layer structure 41 can be a core, in particular a fully cured core.

The electrically conductive layer structure 21 is patterned and thus has recesses 31. The electrically conductive layer structure 21 can be patterned by any conventional patterning methods, for example by lithography and etching processes. Optionally, the surfaces of the electrically conductive layer structure 21 can be provided with an adhesion promoting layer (not shown), for example a so-called V-bond.

A dielectric filling medium 51 is filled in the recesses 31. A further electrically insulating layer structure 61 is applied or laminated on the electrically conductive layer structure 21 and on the dielectric filling medium 51.

The stack comprises a further electrically conductive layer structure 22 on an opposing surface of the electrically insulating layer structure 41. The further electrically conductive layer structure 22 has further recesses 32. A further dielectric filling medium 52 is filled in the further recesses 32. Another electrically insulating layer structure 62 is applied or laminated on the further electrically conductive layer structure 22 and on the further dielectric filling medium 52.

A first outer electrically conductive layer structure 71 is applied or laminated on the further electrically insulating layer structure 61, and a second outer electrically conductive layer structure 72 is applied or laminated on the other electrically insulating layer structure 62. The first and second outer electrically conductive layer structures 71, 72 can be copper foils.

The further electrically insulating layer structure 61 can be made of another material than the dielectric filling medium 51. In the same manner, the other electrically insulating layer structure 62 can be made of another material than the further dielectric filling medium 52. For example, the further electrically insulating layer structure 61 and the other electrically insulating layer structure 62 can be a prepreg, respectively, and the dielectric filling medium 51 and the further dielectric filling medium 52 can be a resin without fibers. However, the dielectric filling medium 51 and/or the further dielectric filling medium 52 can optionally comprise at least one of powder, fluid, and filler particles. The dielectric filling medium 51 can also be a paste, or sheet, in particular a glass free resin sheet such as ABF®.

The dielectric filling medium 51 can have a larger thermal conductivity than the electrically insulating layer structure 41 and the further electrically insulating layer structure 61. In the same manner, the further dielectric filling medium 52 can have a larger thermal conductivity than the electrically insulating layer structure 41 and the other electrically insulating layer structure 62.

The component carrier 1 can comprises at least one component (not shown) being surface mounted on and/or embedded in the component carrier 1, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

At least one of the electrically conductive layer structures 21, 22 of the component carrier 1 can comprise at least one of the group consisting of copper, aluminum, nickel, silver, gold, palladium, and tungsten, any of the mentioned materials being optionally coated with supra-conductive material such as graphene.

The electrically insulating layer structures 41, 51, 52, 61, 62 can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

The component carrier 1 is shaped as a plate in the embodiment. The component carrier 1 can be configured as one of the group consisting of a printed circuit board, a substrate, and an interposer. The component carrier 1 can be configured as a laminate-type component carrier.

Figure 2A:
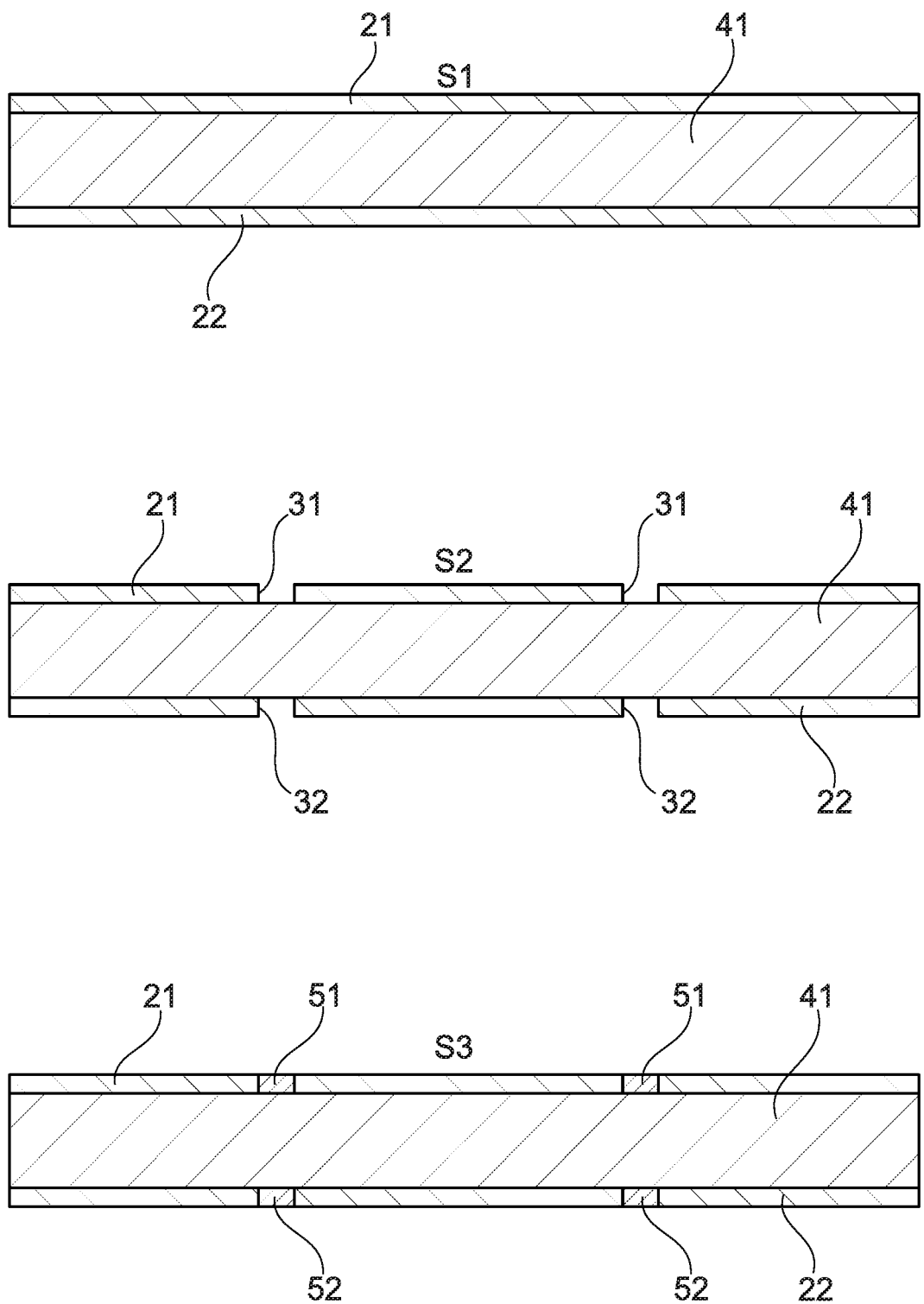
FIGS. 2A and 2B illustrate a method of manufacturing a component carrier according to an exemplary embodiment of the invention.
Figure 2B:
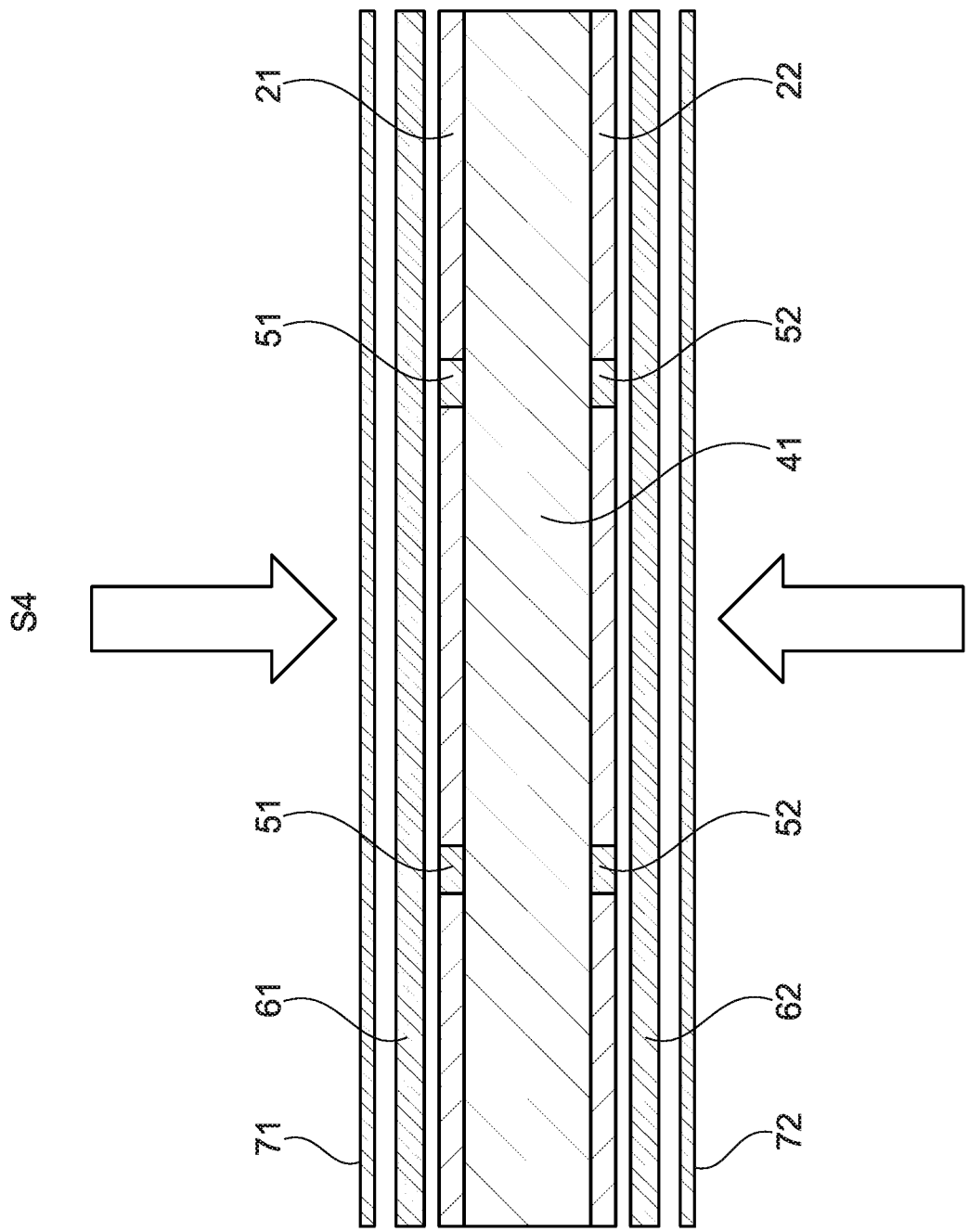

FIGS. 2A and 2B illustrate a method of manufacturing a component carrier 1 according to an exemplary embodiment of the invention. In a step S1, an electrically insulating layer structure 41 is provided which has an electrically conductive layer structure 21 on one side and a further electrically conductive layer structure 22 on the other side. The electrically insulating layer structure 41 can be a core or a fully cured core, and the electrically conductive layer structure 21 and the further electrically conductive layer structure 22 can be a copper layer or a copper foil.

In the step S1, a semi-finished product can be used which consists of the electrically insulating layer structure 41 and the electrically conductive layer structure 21 (and optionally the further electrically conductive layer structure 22).

In a step S2, the electrically conductive layer structure 21 and the further electrically conductive layer structure 22 are patterned by a patterning or structuring process. Here, any conventional patterning or structuring processes can be used and are not described in further detail. For example, lithography and etching processes can be used. After patterning, the electrically conductive layer structure 21 has recesses 31, and the further electrically conductive layer structure 22 has further recesses 32. Optionally, the surfaces of the electrically conductive layer structure 21 and of the further electrically conductive layer structure 22 can be provided with an adhesion promoting layer (not shown), for example a so-called V-bond. The adhesion promoting layer improves an adhesion of a subsequent layer on the electrically conductive layer structure 21 and the further electrically conductive layer structure 22, respectively.

In a step S3, the recesses 31 are filled with a dielectric filling medium 51, and the further recesses 32 are filled with a further dielectric filling medium 52. In the embodiment of FIG. 2A, the recesses 31 and the further recesses 32 are filled with the dielectric filling medium 51 and the further dielectric filling medium 52, respectively, such that outer surfaces of the dielectric filling medium 51 and the further dielectric filling medium 52 are substantially flush with respective outer surfaces of the electrically conductive layer structure 21 and the further electrically conductive layer structure 22, respectively. However, the filling can be made in a manner that the dielectric filling medium 51 under- or overfills the at least one recess 31, and/or that the further dielectric filling medium 52 under- or overfills the at least one further recess 32.

The application of the dielectric filling medium 51 and/or of the further dielectric filling medium 52 can be made by one of the group consisting of dispensing, screen printing, and three-dimensionally reprinting.

After the filling step, the stack can optionally be ground, i.e. the electrically conductive layer structure 21 and the dielectric filling medium 51 can be ground and/or the further electrically conductive layer structure 22 and the further dielectric filling medium 52 can be ground.

Furthermore, the method can comprise a step of selecting a material of the dielectric filling medium 51 and/or of the further dielectric filling medium 52 so as to adjust a thermal conductivity of the component carrier 1.

In a step S4, a further electrically insulating layer structure 61 is laminated on the electrically conductive layer structure 21 and the dielectric filling medium 51, and another electrically insulating layer structure 62 is laminated on the further electrically conductive layer structure 22 and on the further dielectric filling medium 52. For example, the further electrically insulating layer structure 61 and the other electrically insulating layer structure 62 can be a prepreg, respectively. In addition, a first outer electrically conductive layer structure 71 is laminated on the further electrically insulating layer structure 61, and a second outer electrically conductive layer structure 72 is laminated on the other electrically insulating layer structure 62. The first and second outer electrically conductive layer structures 71, 72 can be copper foils.

The lamination of the further electrically insulating layer structure 61, the first outer electrically conductive layer structure 71, the other electrically insulating layer structure 62, and the second outer electrically conductive layer structure 72 can be made in a single lamination step, for example in a single pressing step, where the layers are altogether heated and pressed to form the component carrier 1.

Figure 3:
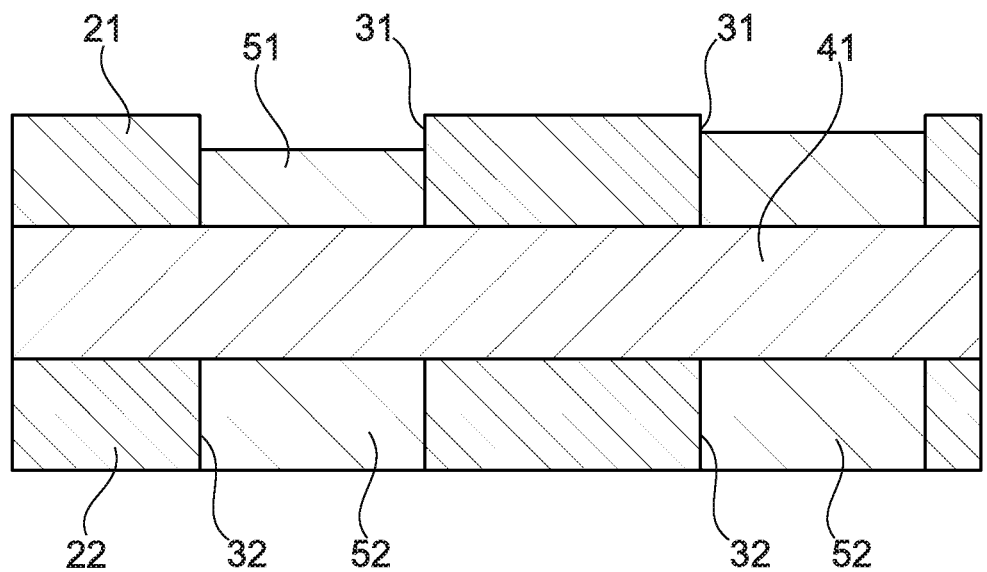
FIG. 3 illustrates a step of filling a recess in a method of manufacturing a component carrier according to an exemplary embodiment of the invention.

FIG. 3 illustrates a step of filling a recess in a method of manufacturing a component carrier 1 according to an exemplary embodiment of the invention. On one side of the electrically insulating layer structure 41, the dielectric filling medium 51 underfills the recesses 31. On the other side of the electrically insulating layer structure 41, the further dielectric filling medium 52 is substantially flush with an outer surface of the further electrically conductive layer structure 22 so that the further recesses 32 are completely filled. Alternatively, the further dielectric filling medium 52 can also underfill or even overfill the further recesses 32.

Figure 4:
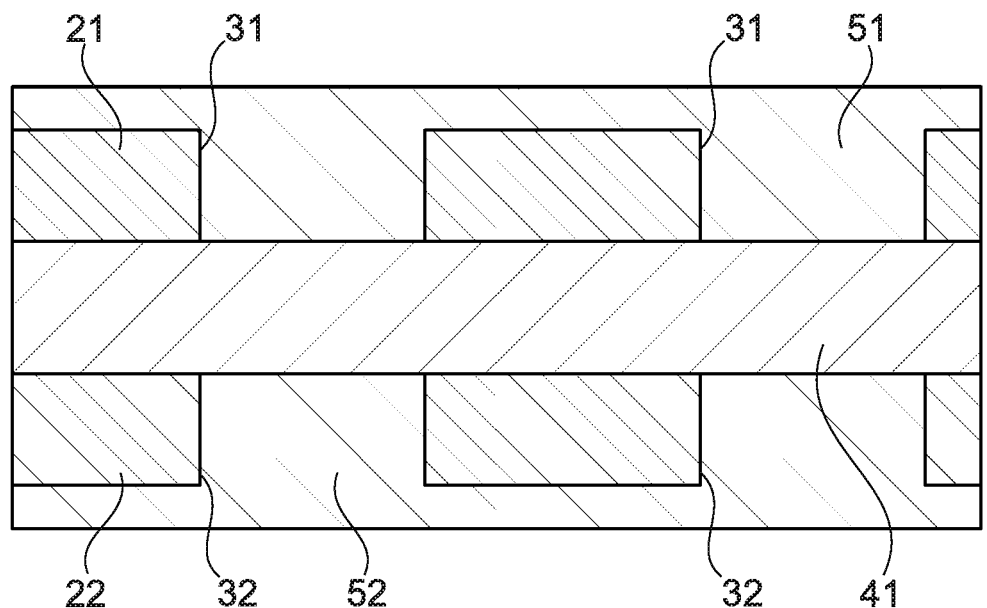
FIG. 4 illustrates a step of filling a recess in a method of manufacturing a component carrier according to an exemplary embodiment of the invention.

FIG. 4 illustrates a step of filling a recess in a method of manufacturing a component carrier 1 according to an exemplary embodiment of the invention. The dielectric filling medium 51 overfills the at least one recess 31, and the further dielectric filling medium 52 overfills the at least one further recess 32. Alternatively, the dielectric filling medium 51 can underfill the recesses 31, or the dielectric filling medium 51 can substantially be flush with an outer surface of the electrically conductive layer structure 21 so that the recesses 31 are filled.

In the embodiments of FIGS. 3 and 4, if the dielectric filling medium 51 shall substantially be flush with the outer surface of the electrically conductive layer structure 21, the dielectric filling medium 51 and the electrically conductive layer structure 21 can be ground. In the same manner, if the further dielectric filling medium 52 shall substantially be flush with the outer surface of the further electrically conductive layer structure 22, the further dielectric filling medium 52 and the further electrically conductive layer structure 22 can be ground. After grinding, the stack has a certain thickness which is advantageous if laser vias are formed in a laser drilling process.

A difference between a maximum and a minimum of at least one of the layer structures can be less than 20%, in particular less than 10%, of the thickness of the respective layer structure.

Figure 5:
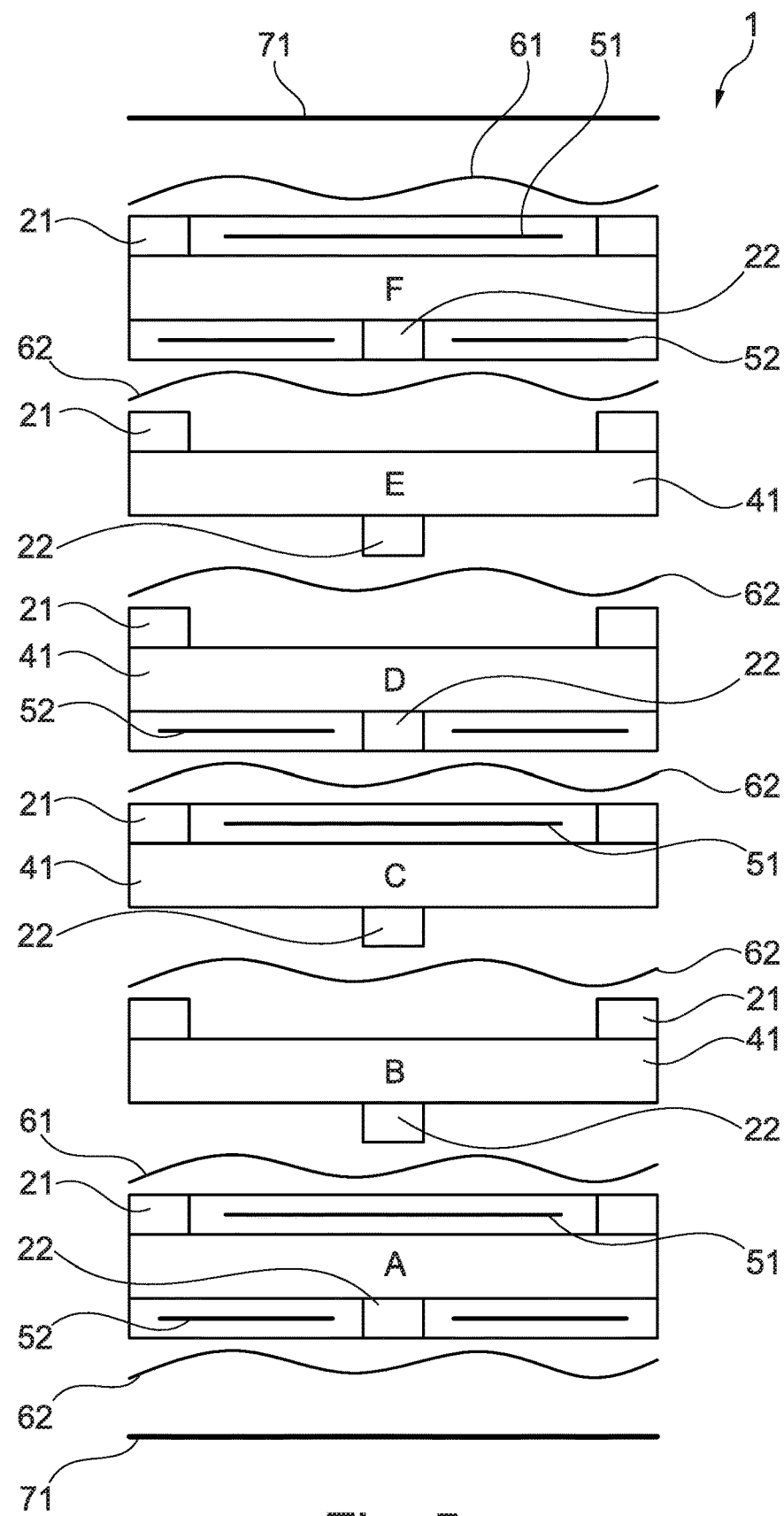
FIG. 5 illustrates a cross-sectional view of a component carrier having multiple cores according to an exemplary embodiment of the invention.

FIG. 5 illustrates a cross-sectional view of a multilayer component carrier 1 according to an exemplary embodiment of the invention. The component carrier 1 has six cores A, B, C, D, E, F, which form respective electrically insulating layer structures 41.

At the uppermost core F, a stack is formed comprising an electrically conductive layer structure 21 having a recess which is filled by a dielectric filling medium 51. A further electrically insulating layer structure 61, here a prepreg, is laminated on the electrically conductive layer structure 21 and on the dielectric filling medium 51. The stack comprises on the opposing side of the electrically insulating layer structure 41 a further electrically conductive layer structure 22 having two further recesses which are filled by a further dielectric filling medium 52. Another electrically insulating layer structure 62, here a prepreg, is laminated on the further electrically conductive layer structure 22 and on the further dielectric filling medium 52.

At the underlying core E, the electrically conductive layer structure 21 has a recess which is not filled by a dielectric filling medium. On the opposing side of the electrically insulating layer structure 41, a further electrically conductive layer structure 22 has two further recesses which are not filled by a further dielectric filling medium.

At the underlying core D, an electrically conductive layer structure 21 has a recess which is not filled by a dielectric filling medium. On the opposing side of the electrically insulating layer structure 41, a further electrically conductive layer structure 22 has two further recesses which are filled by a further dielectric filling medium 52. Another electrically insulating layer structure 62, here a prepreg, is laminated between the further electrically conductive layer structure 22 of the core E and the electrically conductive layer structure 21 of the core D.

At the underlying core C, an electrically conductive layer structure 21 has a recess which is filled by a dielectric filling medium 51. On the opposing side of the electrically insulating layer structure 41, a further electrically conductive layer structure 22 has two further recesses which are not filled by a further dielectric filling medium. Another electrically insulating layer structure 62, here a prepreg, is laminated between the further electrically conductive layer structure 22 of the core D and the electrically conductive layer structure 21 of the core C.

At the underlying core B, the electrically conductive layer structure 21 has a recess which is not filled by a dielectric filling medium. On the opposing side of the electrically insulating layer structure 41, a further electrically conductive layer structure 22 has two further recesses which are not filled by a further dielectric filling medium. Another electrically insulating layer structure 62, here a prepreg, is laminated between the further electrically conductive layer structure 22 of the core C and the electrically conductive layer structure 21 of the core B.

At the lowermost core A, a stack is formed comprising an electrically conductive layer structure 21 having a recess which is filled by a dielectric filling medium 51. The stack comprises on the opposing side of the electrically insulating layer structure 41 a further electrically conductive layer structure 22 having two further recesses which are filled by a further dielectric filling medium 52. A further electrically insulating layer structure 61, here a prepreg, is laminated between the electrically conductive layer structure 21 and the dielectric filling medium 51 of the core A and the further electrically conductive layer structure 22 of the core B. Another electrically insulating layer structure 62, here a prepreg, is laminated on the further electrically conductive layer structure 22 and on the further dielectric filling medium 52 of the core A.

At the outer surfaces of the stack, first and second outer electrically conductive layer structures 71, 72 are laminated, which can be copper foils having a thickness of about 18 µm.

It is to be noted that the further electrically insulating layer structures 61 and the other electrically insulating layer structures 62, which are prepregs in this embodiment, and the first and second outer electrically conductive layer structures 71, 72 are laminated after filling the recesses by the dielectric filling medium 51 and the further dielectric filling medium 52, respectively, of the respective cores A to F. Instead of the prepregs, resin sheets without fibers can also be used.

The component carrier 1 comprises cores A and F, in which all recesses are filled by dielectric mediums. Other cores B and E have recesses which are not filled by dielectric mediums. Other cores C and D in turn have some recesses which are filled by dielectric mediums and other recesses which are not filled by dielectric mediums. Although some recesses of the component carrier 1 are not filled by dielectric mediums, it turned out that the relief transfer could sufficiently be compensated for.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
    a stack including an electrically conductive layer, having a plurality of recesses, on an electrically insulating layer structure, wherein at least one of the plurality of recesses in the electrically conductive layer is at least partially filled by a dielectric medium and at least another one of the plurality of recesses in the electrically conductive layer is not filled by the dielectric medium; and
    a further electrically insulating layer structure on the electrically conductive layer and on the dielectric filling medium.

2. The component carrier according to claim 1, wherein the stack includes a further electrically conductive layer structure, having at least one further recess, on an opposing surface of the electrically insulating layer structure;
    a further dielectric filling medium filling at least part of the at least one further recess; and
    another electrically insulating layer structure on the further electrically conductive layer structure and on the further dielectric filling medium.

3. The component carrier according to claim 1, wherein the dielectric filling medium underfills the recesses and/or the further dielectric filling medium underfills the at least one further recess.

4. The component carrier according to claim 1, wherein the dielectric filling medium overfills the recesses and/or the further dielectric filling medium overfills the at least one further recess.

5. The component carrier according to claim 1, wherein the further electrically insulating layer structure is made of the same material like the dielectric filling medium or of another material than the dielectric filling medium.

6. The component carrier according to claim 1, wherein the dielectric filling medium comprises at least one of powder, fluid, filler particles, a paste, and a sheet.

7. The component carrier according to claim 1, wherein the dielectric filling medium has a larger thermal conductivity than at least one of the electrically insulating layer structure and the further electrically insulating layer structure.

8. The component carrier according to claim 1, wherein the electrically insulating layer structure is a core, in particular a fully cured core.

9. The component carrier according to claim 1, wherein the further electrically insulating layer structure is laminated on the electrically conductive layer and the dielectric filling medium.

10. The component carrier according to claim 1, comprising at least one of the following features:
the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of a group consisting of copper, aluminum, nickel, silver, gold, palladium, and tungsten;
wherein the electrically insulating layer structure comprises at least one of a group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of a group consisting of a printed circuit board, a substrate, and an interposer;
wherein the component carrier is configured as a laminate-type component carrier.

11. A method of manufacturing a component carrier, comprising:
forming a stack including an electrically conductive layer, having a plurality of recesses, on an electrically insulating layer structure, wherein at least one of the plurality of recesses in the electrically conductive layer is at least partially filled by a dielectric medium and at least another one of the plurality of recesses in the electrically conductive layer is not filled by the dielectric medium;
thereafter forming a further electrically insulating layer structure on the electrically conductive layer and on the dielectric filling medium.

12. The method according to claim 11, wherein the method comprises applying the dielectric filling medium by one of a group consisting of dispensing, screen printing, and three-dimensionally reprinting.

13. The method according to claim 11, wherein the method comprises adjusting the thermal conductivity of the component carrier by selecting the dielectric filling medium.

* * * * *